(12) United States Patent
Naser et al.

(10) Patent No.: US 11,101,211 B2
(45) Date of Patent: Aug. 24, 2021

(54) SEMICONDUCTOR DEVICE WITH BACKSIDE INDUCTOR USING THROUGH SILICON VIAS

(71) Applicant: International Business Machines Corporation, Armonk, NY (US)

(72) Inventors: Hassan Naser, Austin, TX (US); Calist Friedman, Austin, TX (US); Matthew A. Cooke, Cedar Park, TX (US); Daniel L. Stasiak, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/583,524

(22) Filed: Sep. 26, 2019

(65) Prior Publication Data

US 2021/0098370 A1 Apr. 1, 2021

(51) Int. Cl.
*H01L 23/522* (2006.01)
*H01L 23/48* (2006.01)
*H01L 49/02* (2006.01)
*H01L 21/768* (2006.01)
*H01L 23/525* (2006.01)

(52) U.S. Cl.
CPC .... *H01L 23/5227* (2013.01); *H01L 21/76894* (2013.01); *H01L 21/76898* (2013.01); *H01L 23/481* (2013.01); *H01L 23/5258* (2013.01); *H01L 28/10* (2013.01)

(58) Field of Classification Search
CPC ............... H01L 23/645; H01L 23/5258; H01L 23/5227; H01L 23/481; H01L 23/5256; H01L 28/10; H01L 21/76894; H01L 21/76898
See application file for complete search history.

(56) References Cited

U.S. PATENT DOCUMENTS 8,941,212 B2 1/2015 Yen
9,553,080 B1 1/2017 England
(Continued)

FOREIGN PATENT DOCUMENTS

GB 2520149 A 5/2015

OTHER PUBLICATIONS

Bontzios et al., "Prospects of 3D inductors on through silicon vias processes for 3D ICs", Conference Paper—Oct. 2011, ResearchGate, 5 pages, <https://www.researchgate.net/publication/261096550_Prospects_of_3D_inductors_on_through_silicon_vias_processes_for_3D_ICs/download>.

*Primary Examiner* — Sue A Purvis
*Assistant Examiner* — Scott Stowe
(74) *Attorney, Agent, or Firm* — Alexander G. Jochym

(57) ABSTRACT

An approach to creating a semiconductor chip including a semiconductor substrate with one or more topside metal layers and one or more backside metal layers. The approach creates the semiconductor chip with one or more semiconductor devices with wiring interconnects in the one or more topside metal layers on the semiconductor substrate and one or more inductors in the one or more backside metal layer. Furthermore, the approach creates the semiconductor chip with one or more through silicon vias extending through the semiconductor substrate connecting the one or more inductors in the one or more backside metal layers and the one or more semiconductor devices with wiring interconnects in the one or more topside metal layers on the semiconductor substrate.

19 Claims, 3 Drawing Sheets

(56) References Cited

U.S. PATENT DOCUMENTS

| | | | |
|---|---|---|---|
| 9,716,056 B2 * | 7/2017 | Leobandung | ....... H01L 23/5227 |
| 9,786,581 B2 | 10/2017 | Kamgaing | |
| 9,881,990 B2 | 1/2018 | Duevel | |
| 10,032,850 B2 | 7/2018 | Cook | |
| 2007/0205855 A1 * | 9/2007 | Hashimoto | .......... H01Q 1/2283 |
| | | | 336/200 |
| 2009/0127667 A1 | 5/2009 | Iwata | |
| 2015/0230342 A1 | 8/2015 | Hsu | |
| 2017/0148750 A1 | 5/2017 | Saraswat | |

* cited by examiner

SEMICONDUCTOR DEVICE WITH BACKSIDE INDUCTOR USING THROUGH SILICON VIAS

BACKGROUND OF THE INVENTION

The present invention relates generally to the field of semiconductor technology, and more particularly to semiconductor devices electrically connected to one or more inductors on the backside of a semiconductor chip using through silicon vias.

In the manufacture of integrated circuits, there is a continuing desire to fit more semiconductor devices and circuits on semiconductor wafers. The drive for miniaturization and increasing circuit density is driven by a number of factors, including device speed, as denser circuits are closer together for fast communication, increasing wafer utilization (more circuits per wafer) and potential semiconductor chip cost reduction as the number of semiconductor chips per wafer increase. Increasing interconnection wiring between semiconductor devices and vias connecting wiring layers can drive more layers in the back end of the line to complete device circuit connections and to distribute power.

One development in semiconductor chips to improve circuit density and performance in semiconductor chips is a use of through silicon vias. A through silicon via provides a vertical electrical connection that passes completely through a semiconductor wafer or semiconductor substrate. Traditionally, semiconductor chip design was limited to wiring layers on a single semiconductor wafer surface or side. The development of through silicon vias provides an ability to deposit and utilize backside metal on semiconductor wafers.

SUMMARY

A semiconductor chip including a semiconductor substrate with one or more topside metal layers and one or more backside metal layers. The semiconductor chip including one or more semiconductor devices with wiring interconnects in the one or more topside metal layers on the semiconductor substrate and one or more inductors in the one or more backside metal layers. Furthermore, the semiconductor chip includes one or more through silicon vias extending through the semiconductor substrate connecting the one or more inductors in the one or more backside metal layers and the one or more semiconductor devices with wiring interconnects in the one or more topside metal layers on the semiconductor substrate.

DETAILED DESCRIPTION

Figure 1:
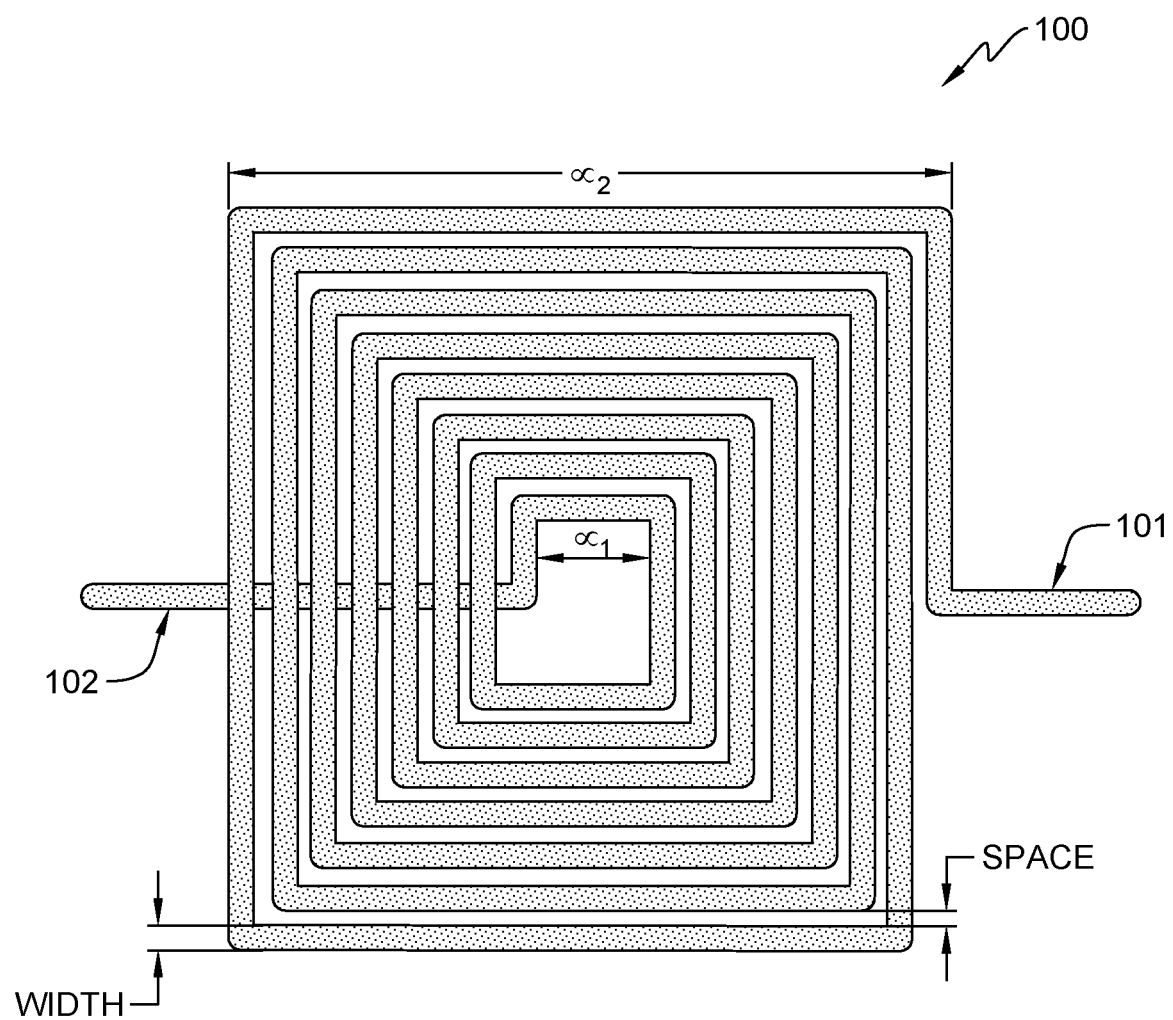
FIG. 1 depicts a top view of an inductor on a backside metal layer of a semiconductor substrate, in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a substrate during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be described. It should be understood that the following description is rather focused on the distinctive features or elements of the various embodiments of the present invention.

Embodiments of the present invention recognize that increasing circuit density may require a large number of wiring interconnect layers to escape device I/O connections to a wafer surface while also providing increasing circuit performance. Embodiments of the present invention recognize that inductors are needed for performance requirements. Embodiments of the present invention recognize that some high-performance semiconductor chips include circuit elements for resonant clocking and phase locked loops that use inductors. Embodiments of the present invention recognize that inductors are large components that consume a significant amount of area on a metal layer that reduces the area on the metal layer available for other circuit wiring in a semiconductor chip. Additionally, embodiments of the present invention recognize that optimal performance of inductors requires a minimum amount of space between inductors and adjacent wires and circuits. Embodiments of the present invention recognize the use of additional space for inductors on a metal layer is area that is not available for wiring, semiconductor devices, or interconnections between various metal layers. Embodiments of the present invention recognize that accurate modelling of inductors is difficult and presents challenges due to manufacturing process variations in uniformly forming inductors and effects of materials adjacent or material layers under the inductors, including effects of different doping levels within a layer or a material in proximity to or under the inductor.

Embodiments of the present invention propose forming one or more inductors on a backside of a semiconductor substrate using one or more through silicon vias (TSVs) for electrical connections between inductors on the backside of the semiconductor substrate and circuits formed on one or more metal layers on a topside of the semiconductor substrate. Embodiments of the present invention provide additional available area on topside metal layers of the semiconductor substrate for wiring, devices, and circuits by moving inductors to the backside metal layers of the semiconductor substrates using TSVs for electrical connections between topside metal layers and backside metal layers of the semiconductor substrate. Embodiments of the present invention provide more wiring area for the semiconductor chip by using the backside metal layers under the semiconductor substrate which allows for formation of larger and/or more inductors without reducing topside metal layer wiring area for circuits, devices, power redistribution, interconnections, and backend of line (BEOL) wiring and interconnects. Embodiments of the present invention provide larger inductors on semiconductor chips by using backside metal layers to form inductors with longer lines that provide more inductance that are connected to topside metal layers by TSVs. Embodiments of the present invention provide an ability to form inductors on the backside of semiconductor chips with thicker metal layers than metal layers utilized on the topside of the semiconductor chip for wiring and semiconductor devices using smaller feature sizes requiring thinner metal layer deposition and patterning. Additionally, embodiments of the present invention provide more robust electrical connectivity of inductors on backside metal layers to other topside metal layers using TSVs with larger diameters than vias typically used between topside metal layers in semiconductor chips.

Embodiments of the present invention provide a method to provide more inductors and to select different inductance values using backside inductors and TSVs for electrical connections between topside metal layers and backside metal layer on the semiconductor substrate. Embodiments of the present invention provide an ability to change or select a different inductance dynamically when changing from one clock frequency to another clock frequency. Embodiments of the present invention provide methods to improve semiconductor chip design, and therefore, more quickly provide a manufactured semiconductor chip. Embodiments of the present invention provide methods to quickly and easily provide different levels of inductance to various circuits in the semiconductor chip. Embodiments of the present invention provide several ways to provide different inductance to different circuits including using a pre-set inductor design for one or more backside metal layers and changing by a backside metal mask design for inductors and/or connections to TSVs or by selectively removing connections to one or more inductors using a fuse. Embodiments of the present invention provide methods to change an inductance level in a semiconductor chip design with or without a pre-set backside inductor design by changing a number of backside inductors connected to the circuit, by changing which backside inductor is connected to the circuit, or changing a combination of the number of backside inductors connected and the backside inductor connected to the circuit with another backside inductor providing a different inductance.

Embodiments of the present invention provide backside inductors connected by TSVs for semiconductor wiring and device connections from inductors to circuits with lower resistance, less power loss, and less inductor variability of inductors on the backside metal layers of the semiconductor substrate that may be closer to the circuits and wiring formed on the topside metal layers. Embodiments of the present invention provide shorter electrical paths between inductors formed on the backside of the semiconductor substrate and the circuits. Additionally, embodiments of the present invention provide better performance of inductors created on the backside of the semiconductor substrate due to a reduction of eddy currents. Embodiments of the present invention provide a method reducing eddy currents produced in surrounding wiring that result in lower an inductance level by moving inductors to backside metal layers on the semiconductor chip rather than forming inductors on topside metal layers (e.g., between wiring layers or a power grid). Embodiments of the present invention provide isolation of inductors on the backside metal layers of the semiconductor substrate reducing eddy current effects, reducing variability of inductor performance due different inductor location with different types of surrounding circuits and wiring, and similarly, improving ability to model inductor performance (i.e., less variability due to surrounding wires, circuits, and inductor physical shape due to variations in inductor geometry due to various processing/metallization variations caused, in part, by nearby wiring or device features).

Embodiments of the present invention provide easier and more accurate inductor modelling with backside metal layer inductors due to more uniform processing of inductors, more space and less nearby circuits or electrical elements. Additionally, embodiments of the present invention provide easier and more accurate inductor modelling with backside metal layer inductors because of less impact of components, coupling, or doping effects of metal layers or semiconductor substrate beneath inductors since the inductors are isolated on backside metal layers under the semiconductor substrate FIG. 1 depicts a top view of inductor 100 on a backside metal layer of a semiconductor substrate, in accordance with an embodiment of the present invention. As depicted, FIG. 1 includes inductor 100 constructed with lines with width W and spacing S between the lines forming rectangular elements in a coil like or inward spiraling square-like elements with outer dimension α2 and inner dimension α1 of the inward spiraling square-like elements. In various embodiments, an outer element of the inward spiraling square-like elements of inductor 100 begins line 101 on a first metal layer on the backside of the semiconductor substrate and exits an interior element of the inward spiraling square-like elements of inductor 100 using a via (not depicted) to line 102 on a second metal layer directly below the first metal layer on the backside of the semiconductor substrate. For example, inductor 100 with line 101 may be formed on a bottom metal layer, although inductor 100 is not limited to formation on the bottom metal layer, on the bottom side of a semiconductor substrate (not depicted) using any known processes and materials for inductor formation. Additionally, multiple layers of coil structures can be constructed in series to create inductors with greater inductance.

Inductor 100 may be designed according to commonly used electrical design practices. Inductor 100 can be electrically connected to one or more metal layers or one or more semiconductor devices residing on a top surface of the semiconductor substrate by one or more TSVs (not depicted in FIG. 1). In various embodiments, inductor 100 are connected to one or more TSVs that extend from one or more of the metal layers and dielectric layers on the top surface of the semiconductor substrate through the semiconductor substrate to inductor 100. For example, inductor 100 may be connected to TSVs (not depicted).

In various embodiments, more than one inductor 100 is present on the backside of the semiconductor substrate. In some embodiments, a plurality of inductor 100 have a same size. In other embodiments, the plurality of inductor 100 have different sizes. For example, various sizes of inductor 100 may be used to provide different levels of inductance in different sized inductor 100 (e.g., larger inductor 100 may provide higher inductance). In one embodiment, one or more of inductor 100 have a different shape. For example, inductors 100 may have one or more of a different width of an inductor coil or line (e.g., line 101), a different spacing of inductor coils or lines (e.g., spacing between line 101 in inductor 100), a different line thickness, a different number of spirals or coils, a different outer dimension ($\alpha 2$), or a different inner dimension ($\alpha 1$) where the different size of inductor 100 creates a different inductance. In various embodiments, the plurality of inductors 100 are wired together in parallel with a fuse between each of the inductors of the plurality of inductor 100. In some embodiments, a wiring connection between various inductors of the plurality does not have one or more fuses but is changeable. For example, in some cases, a mask change for one or more of the backside metal layers may change connections between the plurality of inductor 100 or may change a size or shape of inductor 100 (e.g., changes an inductance of inductor 100).

In various embodiments, inductor 100 is composed of copper. In some embodiments, inductor 100 is composed of graphene or tungsten. In an embodiment, inductor 100 is composed of any known material capable of forming inductor coils on one or more layers of the backside of the semiconductor substrate.

In various embodiments, inductor 100 resides on one or more metal layers beneath the semiconductor substrate. In various embodiments, the semiconductor substrate is composed of any known semiconductor material used in semiconductor device formation. For example, inductor 100 may reside on a silicon substrate, a silicon germanium substrate, a silicon insulator substrate, or any other semiconductor material or compound semiconductor material including Group IV, V, VI semiconductor materials or compound semiconductor materials from these groups or another suitable group. In an embodiment, inductor 100 resides on a photosensitive semiconductor material for use in an optoelectronic application, photo electrolysis application, or other phonic related application.

Figure 2:
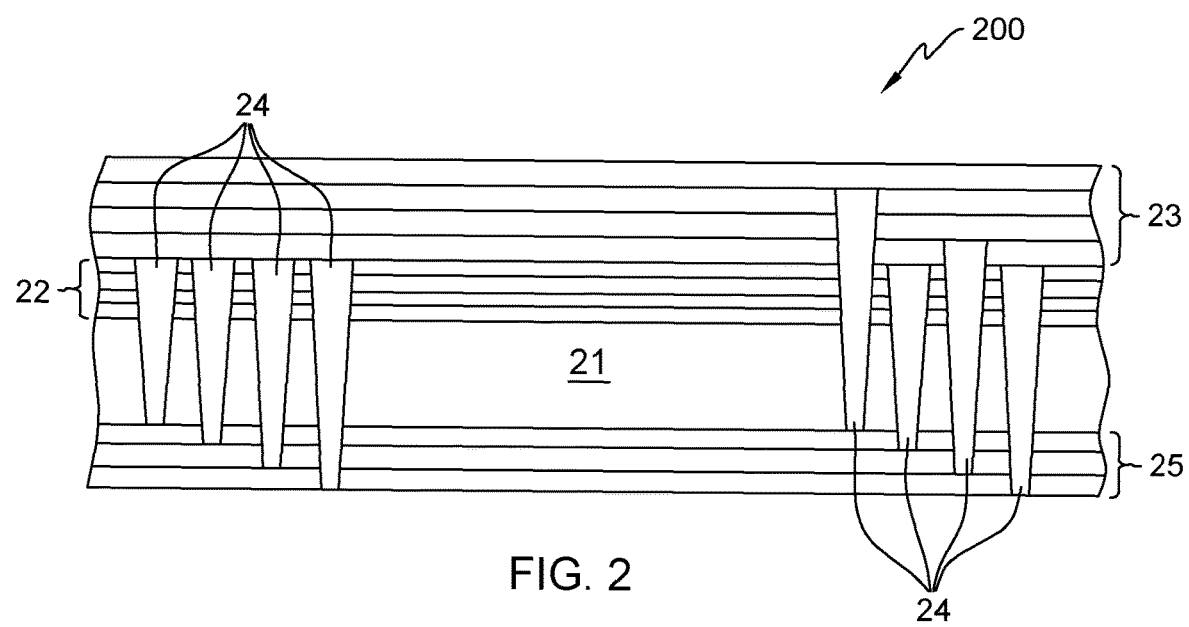
FIG. 2 depicts a cross-sectional view of a semiconductor structure after fabrication steps to form through silicon vias from one or more backside metal layers beneath the semiconductor substrate metal layers to one or more metal layers on a top surface of the semiconductor substrate, in accordance with an embodiment of the present invention.

FIG. 2 depicts a cross-sectional view of semiconductor structure 200 after fabrication steps to TSVs 24 from one or more backside metal layers 25 under or beneath semiconductor substrate 21 to more than one upper metal layers 24 and one or more lower metal layers 23 on a top surface of semiconductor substrate 21 in accordance with an embodiment of the present invention. As depicted, FIG. 2 includes semiconductor structure 200 composed of at least semiconductor substrate 21, lower metal layers 22, upper metal layers 23, TSVs 24, and backside metal layers 25. One or more inductors (not depicted in FIG. 2), such as inductor 100 depicted in FIG. 1, may reside on one or more of backside metal layers 25 and may be connected to one or more of upper metal layers 23 or, in some cases, to lower metal layers 23 by TSVs 24. One or more semiconductor devices (not depicted) such as logic or passive device may reside in lower metal layers 22 and/or in upper metal layers 23. In various embodiments, each of the one or more metal layers (e.g., backside metal layers 25, lower metal layers 22, and upper metal layers 23) on semiconductor substrate 21 are separated by one or more dielectric layers that may be connected by one or more vias (not depicted) on the topside or the bottom side of semiconductor substrate 21. While topside metal layers (e.g., lower metal layers 22 and upper metal layers 23) may be connected to backside metal layers 25 with backside inductors (not depicted in FIG. 2) by TSVs 24.

In various embodiments, semiconductor substrate 21 is any suitable semiconductor material for manufacture of semiconductor chips including semiconductor materials used in photonic or optoelectronic devices. In various embodiments, semiconductor substrate 21 is silicon substrate. In another embodiment, semiconductor substrate 21 may be composed of any suitable semiconductor material compatible with semiconductor device processes and TSV formation. For example, semiconductor substrate 21 may be composed of any suitable group IV semiconductor or compound semiconductor material such as Ge or SiGe, any suitable photosensitive semiconductor material, or any suitable group III-IV semiconductor material such as alloys of InGaAs or InGaAsP. A group IV semiconductor material refers to the location of the semiconductor element in a column of the Periodic Table of Elements. Similarly, a group III-V semiconductor material refers to a semiconductor material that includes at least one element or material from group III and at least one element or material from group V of the Periodic Table of Elements. Semiconductor substrate 21 may be doped, undoped, contain doped or undoped regions, or may be strained, unstrained, or a combination thereof.

In various embodiments, lower metal layers 22 include various semiconductor devices (not depicted in FIG. 2) such as one or more vertical field effect transistors (VFETs), FIN field effect transistors (finFETs), wiring, passive device, and any other semiconductor device used in lower level metal layers of a semiconductor chip or photosensitive semiconductor chip but are not limited to these semiconductor devices (e.g., may include any semiconductor features, design elements, or other types of semiconductor devices).

In various embodiments, upper metal layers 23 include wiring interconnects, power distribution, passive devices, semiconductor chip connections/pads, and any other known upper metal layer features on semiconductor substrates created during semiconductor device or chip manufacture (not depicted in FIG. 2). For example, upper metal layers 23 may include redistribution layers, power planes, and other BEOL features such as lines, vias forming BEOL interconnects, and external pads for semiconductor chip connections.

In various embodiments, TSVs 24 are one or more vias through semiconductor substrate 21 electrically connected to one or more metal layers of upper metal layers 23 to one or more metal layers of backside metal layers 25 that include one or more inductors. In an embodiment, TSVs 24 electrically connect one or more backside metal layers of backside metal layers 25 with one or more metal layers of lower metal layers 23 where backside side metal layers 25 include one or more inductors. In various embodiments, TSVs 24 are formed by any known TSV formation process. For example, TSVs 24 formation includes a selective, single step silicon etch process for via etch through semiconductor substrate 21 with TSV isolation layers that may be a dielectric material, such as a nitride, tantalum, tantalum nitride, or oxide materials deposited by a known process such as chemical vapor deposition. TSVs 24 may be filled with a conductive material, such as copper, using deposition processes such as plasma vapor deposition, atomic layer deposition, a wet chemical plating process. TSVs 24 formation are not limited to these methods but may utilize any known TSVs formation process with any known TSV fill materials (e.g., vias may be filled with tungsten, graphene, or other metals in addition to copper). In various embodiments, TSVs 24 are formed before inductors on one or more backside metal layers 25 beneath semiconductor substrate 21. In some embodiments, TSVs 24 are formed after lower metal layers 22, upper metal layers 23, and backside metal layers 25. In an embodiment, TSVs 24 are formed before inductors on one or more backside metal layers. TSVs 24, for example, with copper fill, provide larger diameter for interconnections than traditional vias between various topside metal layers, such as, between lower metal layers 22 and upper metal layers 23 or between two metal layers in upper metal layers 23 on semiconductor substrate 21, and therefore, TSVs 24 can provide better electrical performance interconnections between backside metal layers 25 with inductors and topside metal layers such as lower metal layers 22 or upper metal layers 23 (e.g., lower resistance).

In various embodiments, backside metal layers 25 with inductors (not depicted in FIG. 2) such as inductor 100 in FIG. 1, may be formed using any known semiconductor processes for backside metal layer formation and inductor formation. In various embodiments, backside inductors are formed on an outside or bottom metal layer of backside metal layers 25 and escapes on a next metal layer above the bottom metal layer of backside metal layers 25 (e.g., the second from the bottom layer). However, backside inductors are not limited to the bottom metal layer but, may be on any of backside metal layers 25. Backside metal layers 25 may include one or more inductors of various sizes or of a same size (e.g., same outer dimensions, same inductor line width, same inductor line spacing, same inductor line shape, and a number of inductor turns).

Backside metal layers 25 can be personalized using various backside metal layer designs and masks to create inductors with different inductance. In various embodiments, backside metal layers 25 connect different inductors in order to achieve different semiconductor chip or device performance. In some embodiments, backside metal layers 25 include one or more fuses (not depicted in FIG. 2) as will be discussed below in detail with respect to FIG. 4. When backside metal layers 25 include one or more fuses, a layer of backside metal layers 25, generally, the bottommost layer of backside metal layers 25, can include one or more lines electrically connecting each of the inductors on backside metal layers 25 to a fuse.

In various embodiments, lower metal layers 22 and upper metal layers 23 with one or more semiconductor devices and interconnections (not depicted in FIG. 2) are formed on semiconductor substrate 21 using known semiconductor manufacture processes and then, TSVs 24 are formed through substrate 21 and filled using known TSV processes to connect backside metal layers 25 with inductors (not depicted in FIG. 2). In some embodiments, backside metal layers 25 with inductors are formed after TSVs 24. In an embodiment, backside metal layers 25 with inductors are formed before TSVs 24.

Figure 3:
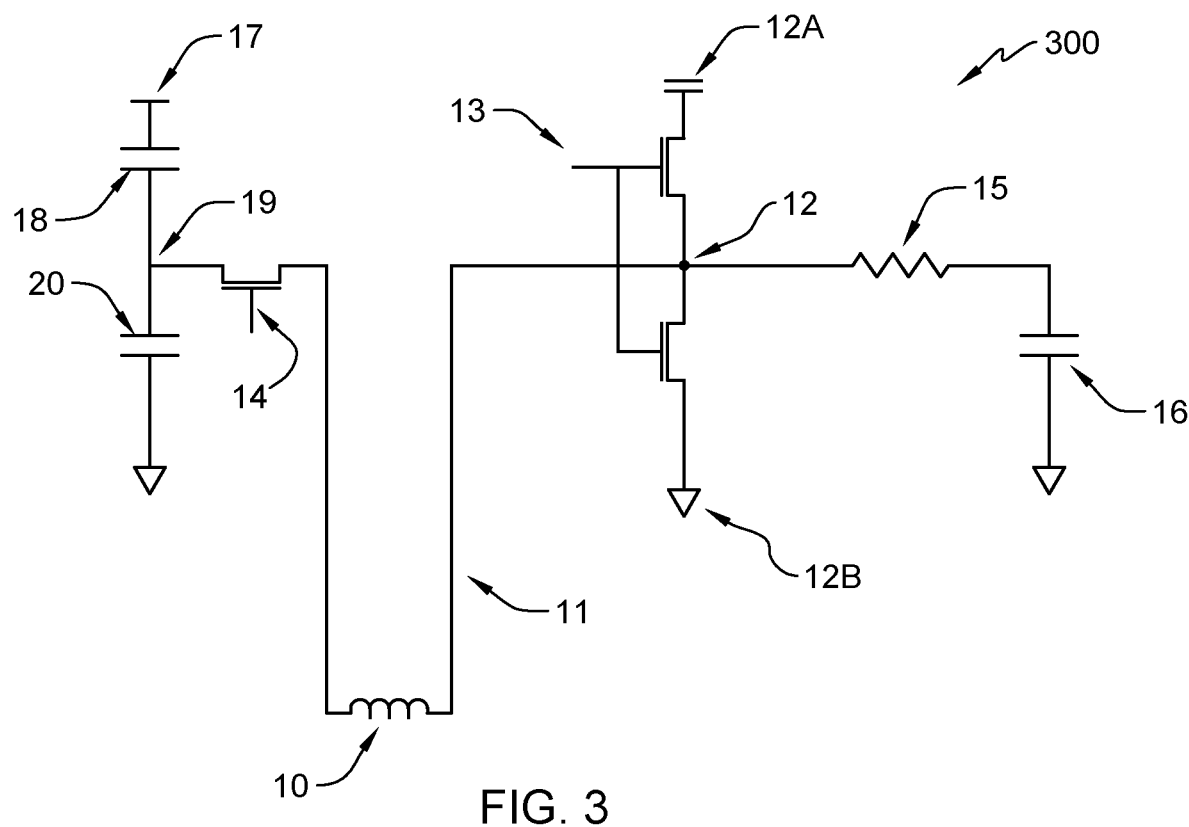
FIG. 3 depicts an example of a schematic diagram of a resonant clock circuit in a semiconductor chip using the one or more backside metal layers for formation of one or more inductors, in accordance with an embodiment of the present invention.

FIG. 3 depicts an example of a schematic diagram of resonant clock circuit 300 in a semiconductor chip using the one or more backside metal layers for formation of inductor 10 in accordance with an embodiment of the present invention. As depicted, FIG. 3 includes inductor 10 connected by a TSV depicted as TSV 11 in the schematic diagram of a simple resonant clock circuit 300. TSV 11 electrically connects inductor 10 on a backside metal layer of the semiconductor chip with clock node 12 as a part of resonant clock circuit 300 on topside metal layers of the semiconductor chip. In various embodiments, resonant clock circuit 300 includes clock node 12 with voltage$_1$ ($V_{DD1}$) 12A, ground (GND) 12B, reference clock 13, switch 14, parasitic resistance 15 of clock network, parasitic capacitance 16 of clock network, voltage ($V_{DD}$) 17, resonant capacitance$_1$ ($C_{DD1}$) 18, resonant mid-point 19, resonant capacitance ($C_{SS}$) 20, and ground$_2$ ($GND_2$) 21. The schematic diagram of resonant clock circuit 300 illustrates an example of how TSV 11 can connect inductor 10 residing on the backside of the semiconductor chip to clock node 12 in one embodiment. While FIG. 3 depicts only one inductor 10 and TSV 11, in other examples of resonant clock circuit 300, one inductor 10 can be connected to two TSV 11 and multiple inductors 10 may be electrically connected to clock node 12 by two or more TSV 11.

Additionally, while FIG. 3 depicts a schematic diagram of resonant clock circuit 300, embodiments of the present invention are not limited to a simple resonant clock circuit utilizing backside inductors, but backside inductors, as depicted in FIG. 3, can be utilized with more complex resonant clock circuits or with any other suitable semiconductor chip circuit application that require a Hi-Q inductor. For example, backside inductor 10 can be utilized in a tank circuit, also known as an LC circuit, which consists of an inductor (L) and a capacitor (C), in a phase-locked loop (PLL) circuit, an analog filter, or a radio frequency (RF) circuit. In addition to the resonant clock application that requires many inductors to be specifically tuned, other analog circuit applications can benefit from an isolated metal stack of thick metals on the semiconductor backside that allows for higher-Q inductors with less noise than thinner frontside metal layers can provide (e.g., backside metal layers not requiring fine line and precise semiconductor device fabrication can be thicker than frontside metal layers with a plurality of semiconductor devices and dense interconnections requiring smaller feature sizes).

In a typical resonant clock circuit design without one or more backside inductor 10, the inductor on a topside metal layer is usually placed closer to the clock network or clock mesh while a transistor switch for the resonant clock circuit is placed on another side of the clock network. Typically, in this case using the inductor on the topside metal layer on the semiconductor substrate, both the inductor and the clock network are routed in one of the higher or upper metal layers. When this occurs, it is undesirable to go down to the semiconductor substrate or one of the lower metal layers to connect to the transistor switch between the inductor and clock network as additional parasitic power consumption occurs even when the transistor switch is off. Providing a backside inductor, such as inductor 10, alleviates the issue of parasitic power consumption as the transistor switch can be placed between inductor 10 and clock network (e.g., clock node 12) using one or more of TSV 11 for connection between inductor 10 and the transistor switch and clock node 12 on topside metal layers of the semiconductor chip.

Additional advantages of backside inductor 10 in resonant clock circuit design 300 include providing more metal layers for inductors without sacrificing wiring area on the topside metal layers of the semiconductor chip. With the additional metal layers available for backside inductor 10, inductor 10 can be longer (e.g., larger) and provide more inductance, therefore, reducing the required capacitance for the resonant frequency of resonant clock circuit 300.

More inductors, such as inductor 10, can be formed on backside metal layers without negative impacts on topside metal for formation of semiconductor devices and semiconductor chip wiring/interconnects (e.g., large inductors do not block wiring channels, reduce semiconductor device area, or reduce area available for power distribution). In some embodiments, identical inductors 10 are formed over portions or over an entire area of various backside metal layers on the semiconductor substrate providing more precise process execution. Without a need to create different semiconductor devices on the backside metal layers where the different semiconductor devices can require different processes and/or different doping materials and levels and/or different via sizes or different line sizes to connect devices, forming a plurality of identical inductors 10 can be done using the same processes (e.g., same metallization processes, same etch processes, etc.) resulting in more uniform inductor 10 structures in each of the plurality of inductors 10 formed on the backside metal layers. The formation of inductor 10 on the backside of the semiconductor substrate provides more consistent inductor features, such as consistent inductor line thickness, line width, line shape, and line spacing, improving consistency of resulting inductance and effectiveness of inductor models.

Additionally, as known to one skilled in the art, challenges in modelling inductors include not only predicting inductance when inductor feature size and shape is not consistent due to process variations and, also includes challenges for effective inductor models due to the effect of semiconductor devices or metal layers under topside inductors. Additionally, both semiconductor substrates under a topside metal layer inductor and various topside semiconductor devices commonly have various regions with different doping materials and different doping levels increasing inductor modelling difficulty (e.g., n and p active regions, n-wells, p-wells, lightly doped semiconductor substrate regions, strained semiconductor substrate regions, etc.). Furthermore, as semiconductor chip design complexity increases and semiconductor feature size reduce, other inductive components such as long transmission lines or busses and signal/clock distribution networks are increasingly present in topside metal layers on the semiconductor substrate. As depicted in FIGS. 2 and 3, creating one or more backside inductor 10 connected to one or more topside metal layers on the semiconductor substrate reduces the above issues by moving inductor 10 to one or more backside metal layers of the semiconductor substrate connected to topside metal layers by one or more TSV 22 creating both more space for inductor 10 and electrical isolation from the effects of other topside metal layer features, such as semiconductor device features on the same metal layer or another metal layer above or below a topside inductor, and doping of various device and semiconductor substrate regions.

Figure 4:
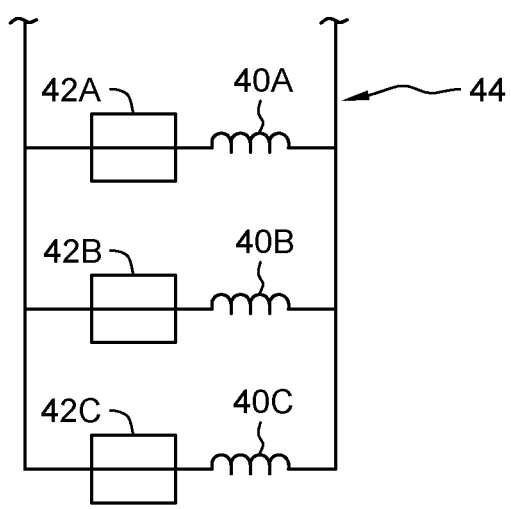
FIG. 4 depicts an example of a method to change connections to the one or more inductors on the one or more backside metal layers, in accordance with an embodiment of the present invention.

FIG. 4 depicts an example of a method to change connections to inductors 40A, 40B, and 40C on one or more backside metal layers on the semiconductor substrate in accordance with an embodiment of the present invention. As depicted, FIG. 4 is a schematic diagram that includes inductors 40A, 40B, and 40C connected to fuses 42A, 42B, and 42C respectively by lines 44 on backside metal of the semiconductor substrate (not depicted in FIG. 4). In various embodiments, inductors 40A, 40B, and 40C and fuses 42A, 42B, and 42C connected by lines 44 reside on the bottommost backside metal layer under the semiconductor substrate. Inductors 40A, 40B, and 40C are not limited to the arrangement depicted, the number of inductors illustrated, or to placement on the bottommost metal below the semiconductor substrate but may be in other metal layers of the backside metal under the semiconductor substrate.

In various embodiments, each inductor of inductors 40A, 40B, and 40C are connected to a fuse of the plurality of fuses 42A, 42B, and 42C in order to provide a method to dynamically select or switch inductance by removing one or more inductors from a semiconductor circuit. For example, inductor 40C can be removed from a semiconductor circuit by severing one of lines 44 using fuse 42C. Fuse 42C can be ignited, for example, using a laser, or by another method that blows off a portion of one of lines 44 thus, separating inductor 42C from lines 44 in fuse 42C area. In this example, using one or more fuses 42A, 42B, and 42C to remove a portion of a line of lines 44 to one or more of inductors 40A, 40B, 40C, respectively, can provide a change in the level of inductance provided to one or more topside metal layers and to one or more semiconductor circuits by removing a connection of one or more of inductors 40A, 40B, and 40C to a topside metal layer in the semiconductor chip. In various embodiments, one or more of fuses 42A, 42B, or 42C is dynamically selected and removed, for example, using a programmable laser. Using one or more of fuses 42A, 42B, and 42C to remove one or more of inductors 40A, 40B, and 40C provides a circuit designer, semiconductor chip designer, or computer system architect with an ability to dynamically change inductance of a circuit by reducing a number inductors connected to lines 44 and the number of inductors or the specific inductor connected to one or more circuits or semiconductor devices residing on the topside metal layers of a semiconductor chip.

In various embodiments, dynamically selecting one or more of fuses 42A, 42B, and 42C to be blown up and thereby reducing the inductance provided gives circuit or semiconductor chip designers an ability to quickly and efficiently change inductance of a circuit without changing masks or semiconductor chip design. Without changing backside metal or TSV masks, using one or more of fuses 42A, 42B, or 42C and a laser, a designer can provide a different inductor connection or a different number of inductor connections to a circuit for a quick and easy method to change inductance of a circuit (e.g., changes the number of inductors 40A, 40B, and 40C connected to the circuit). For example, in resonant clock circuit 300 discussed above with respect to FIG. 3, it is possible to select a different inductance value on the fly or dynamically using one or more of fuses 42A, 42B, or 42C when changing from one clock frequency to another clock frequency. Generally, an inductance value is fixed for each clock frequency, therefore, a desired change in a clock frequency required a change in the inductance. The method discussed above provides semiconductor chip and computer system designers with a very quick, easy, and inexpensive way to provide additional clock frequencies without semiconductor chip design changes and associated mask changes that drive both expense and increase turnaround time (TAT) for new semiconductor chip designs (e.g., design time, mask build time, and new mask cost).

In another embodiment, a mask change for one or more backside metal layers on the semiconductor chip is done to change a number of parallel connections of lines 44 to inductors 40A, 40B, or 40C. For example, removing a section of lines 44 connecting inductor 40B to inductor 40A and 40C would change an inductance provided to the semiconductor circuits above in the topside metal layers. In this example, a design change to the bottom layer of the semiconductor chip design and a new mask can easily change an inductance to one or more semiconductor circuits in the semiconductor chip. In various embodiments, a design change to one or more of inductors 40A, 40B, or 40C or to one or more of lines 44 includes a mask change to a backside metal layer of the semiconductor chip. For example, the mask change can change a size of one or more of inductors 40A, 40B, or 40C or the mask change can change one or more of lines 44 to change a number of inductors 40A, 40B, or 40C connected by lines 44 and TSVs to the topside metal layers of the semiconductor chip. In one example, either an inductor size is changed or a number of inductors connected to lines 44 are changed.

In various embodiments, providing inductors 40A, 40B, and 40C on the backside metal layers of the semiconductor chip improves a turnaround time to model inductance and manufacture the semiconductor chip by creating the tape out (e.g., for primary masks) first, defining TSVs, and then, modelling the backside inductors to determine backside metal masks. In this way, more time can be available to model and customize inductor design without impacting semiconductor chip manufacture TAT. Designs and masks for semiconductor devices, power distribution, and the like for the topside metal layers of the semiconductor chip may be completed first, and using the sequencing delay, modelling of inductors 40A, 40B, and 40C and masks for the backside metal layers with inductors 40A, 40B, and 40C can be completed as masks, for example, masks 1-20 are being fabricated for topside metal layers of the semiconductor chip.

In various embodiments, a pre-set or pre-defined layout of a plurality of backside inductors, such as inductors 40A, 40B, and 40C, are designed for use in multiple semiconductor chip designs, where the pre-defined backside inductor layout is used in more than one semiconductor chip design and the pre-designed backside inductor layout can be customized using one of the above methods, such as fuses 42A, 42B, and 42C or a change in a backside mask design (e.g., removing one or more of lines 44 connecting a backside inductor or inductors to a TSV 11). The use of pre-set or pre-designed inductor layout on one or more backside metal layers may improve semiconductor design time TAT and inductor modelling time. The ease of changing a pre-defined backside inductor connection to topside semiconductor circuits using a fuse to remove a connection of the inductor to a TSV or to a line (e.g., one of lines 44) connecting a number of backside inductors in parallel provides a semiconductor chip designer with a fast, easy method of changing or customizing a circuit inductance and performance. Similarly, changing or removing connections of one or more backside inductors to topside semiconductor circuits by changing a mask design or mask for a backside metal layer on the semiconductor chip can be both relatively quick and inexpensive.

In various embodiments, the pre-set or pre-designed layout of the plurality of backside inductors includes one of a set of different sizes or shaped inductors, a plurality of a same inductor (e.g., a same size, a same shape, and a same inductance), or a combination of several different inductor designs included with a number of the same inductors (e.g., same size, shape and inductance). The method of providing a pre-set layout of backside inductors for one or more backside metal layers provides improved design and mask TAT, ease of changing inductance using quick and inexpensive methods, and improves inductor modelling time (e.g., one model which may be altered according to inductors connected to TSVs).

In some embodiments, the semiconductor chips formed with inductors on one or more backside metal layers on the semiconductor substrate with one or more TSVs connecting the backside metal layers with one or more topside metal layers that include one or more semiconductor devices on the semiconductor substrate of metal, formed by one or more of the methods or process described above, may be diced in semiconductor chip form. The resulting semiconductor chips can be distributed by the fabricator in raw wafer form (that is, as a single wafer that has multiple unpackaged chips) as a bare die or in a packaged form. In the latter case, the chip is mounted in a single chip package (such as a plastic carrier, with lead that is affixed to a motherboard or other higher level carrier) or in a multichip package (such as a ceramic carrier that has either or both surface interconnections or buried interconnections). In any case the chip is then integrated with other chips, discreet circuit elements, a motherboard, or an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor chip, comprising:
   a semiconductor substrate with one or more topside metal layers and one or more backside metal layers;
   one or more semiconductor devices with wiring interconnects in the one or more topside metal layers metal layers on the semiconductor substrate;
   one or more inductors in the one or more backside metal layers on the semiconductor substrate;
   one or more through silicon vias extending through the semiconductor substrate connecting the one or more inductors in the one or more backside metal layers to the one or more semiconductor devices with wiring interconnects in the one or more topside metal layers metal layers on the semiconductor substrate;

one or more lines on the one or more backside metal layers on the semiconductor substrate connecting to each inductor of the one or more inductors in the one or more backside metal layers and connecting to at least one of the one or more through silicon vias; and one or more fuses on the one or more backside metal layers on the semiconductor substrate, wherein each fuse of the one or more fuses is connected to at least one inductor of the one or more inductors and to at least one line of the one or more lines on the one or more backside metal layers.

2. The semiconductor chip of claim 1, wherein the one or more inductors in the one or more backside metal layers on the semiconductor substrate have more than one size, wherein each different size is determined by a different outer dimension of the one or more inductors and a different inner dimension of the one or more inductors.

3. The semiconductor chip of claim 2, wherein the one or more inductors in the one or more backside metal layers on the semiconductor substrate having more than one size that is a different inductor size due to a different inductor length determined by a different number of inductor coils.

4. The semiconductor chip of claim 2, wherein the one or more inductors in the one or more backside metal layers under the semiconductor substrate having more than one size includes an inductor line with at least one inductor with a different inductor line width and a different inductor line spacing.

5. The semiconductor chip of claim 1, further comprising:
blowing one fuse of the one or more fuses using a laser to remove a connection of an inductor of the one or more inductors on the one or more backside metal layers to each inductor of the one or more inductors on the one or more backside metal layers.

6. The semiconductor chip of claim 5, wherein removing the connection of the inductor to the one or more inductors changes an inductance provided to a semiconductor device one of more semiconductor devices in the one or more metal layers on the topside of the semiconductor substrate connected by at least one through silicon via of the one or more through silicon vias.

7. The semiconductor chip of claim 1, wherein the one or more inductors in the one or more backside metal layers on the semiconductor substrate have a same size.

8. The semiconductor chip of claim 1, wherein the one or more inductors in the one or more backside metal layers on the semiconductor substrate have a same inductance.

9. The semiconductor chip of claim 1, wherein the one or more inductors are on one layer of the one or more backside metal layers on the semiconductor substrate.

10. The semiconductor chip of claim 9, wherein the one or more inductors are on a bottommost layer of the one or more backside metal layers on the semiconductor substrate.

11. The semiconductor chip of claim 1, wherein the one or more fuses are on a bottommost layer of the one or more backside metal layers on the semiconductor substrate.

12. A method of forming a semiconductor chip with one or more backside inductors, the method comprising:
forming one or more topside metal layers with a plurality of semiconductor devices and a plurality of interconnects on a semiconductor substrate;
forming one or more backside metal layers with one or more inductors on the semiconductor substrate, wherein the one or more backside metal layers includes at least one or more lines and one or more fuses with each fuse of the one or more fuses connecting to at least one inductor of one or more inductors; and
forming one or more through silicon vias connecting the one or more backside metal layers of the semiconductor substrate with the one or more inductors to the one or more topside metal layers with the plurality of semiconductor devices and the plurality of interconnects on the semiconductor substrate, wherein the one or more through silicon vias connect to the at least one inductor of the one or more inductors.

13. The method of claim 12, wherein the one or more backside metal layers with the one or more inductors is a pre-set design for use with more than one semiconductor chip, and wherein the pre-set design with a same number of inductors and a same size for the one or more inductors.

14. The method of claim 12, wherein forming one or more lines on the backside of the semiconductor substrate includes connecting each fuse of the one or more fuses to the least one inductor of the one or more inductors.

15. The method of claim 14, further comprises removing at least one fuse of the one or more fuses using a laser, wherein the at least one fuse of the one or more fuses connects to the at least one inductor of the one or more inductors.

16. The method of claim 15, further comprises reducing an inductance provided to the one or more topside metal layers by the one or more through silicon vias by removing a number of the at least one fuse of the one or more fuses that connect to the at least one inductor of the one or more inductors.

17. The method of claim 12, wherein an inductance provided to the one or more topside metal layers by the one or more inductors on the one or more backside metal layers is determined by a number of the one or more inductors connected to the one or more through silicon vias.

18. The method of claim 12, wherein the one or more inductors include more than one inductor size.

19. The method of claim 12, wherein forming the one or more fuses with each fuse of the one or more fuses connecting to the at least one inductor of the one or more inductors further comprises using a laser to remove a connection of at least one fuse of the one or more fuses in a resonant clock circuit to select a different inductance value for the resonant clock circuit when changing from a first clock frequency to a second clock frequency in the resonant clock circuit.

* * * * *